United States Patent
Wen et al.

(10) Patent No.: US 12,422,744 B2
(45) Date of Patent: *Sep. 23, 2025

(54) PHOTOMASK INSPECTION METHOD AND APPARATUS THEREOF

(71) Applicant: TAIWAN SEMICONDUCTOR MANUFACTURING COMPANY LTD., Hsinchu (TW)

(72) Inventors: Chih-Wei Wen, Tainan (TW); Hsin-Fu Tseng, Hsinchu County (TW); Chien-Lin Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/765,359

(22) Filed: Jul. 8, 2024

(65) Prior Publication Data

US 2024/0361684 A1    Oct. 31, 2024

Related U.S. Application Data

(63) Continuation of application No. 18/185,407, filed on Mar. 17, 2023, now Pat. No. 12,072,621, which is a
(Continued)

(51) Int. Cl.
*G03F 1/84*     (2012.01)
*G03F 7/00*     (2006.01)

(52) U.S. Cl.
CPC ............... *G03F 1/84* (2013.01); *G03F 7/702* (2013.01); *G03F 7/70608* (2013.01)

(58) Field of Classification Search
CPC ... G03F 1/84; G03F 1/86; G03F 7/702; G03F 7/70608; G03F 1/24; G03F 1/22; G03F 1/68; G03F 1/72; G03F 1/82; G03F 7/70483; G03F 7/705; G03F 7/70605–706851; G03F 7/70; G03F 7/70058; G03F 7/70091–70116; G03F 7/70133; G03F 7/70283; G03F 7/7055;
(Continued)

(56) References Cited

U.S. PATENT DOCUMENTS 11,614,684 B2 *   3/2023   Wen ................. G03F 1/84
                                                   430/5
12,072,621 B2 *   8/2024   Wen ............. G03F 7/70608
(Continued)

FOREIGN PATENT DOCUMENTS

JP           2013055169 A   *   3/2013

OTHER PUBLICATIONS

English translation of JP2013-055169, published Mar. 21, 2013. (Year: 2013).*

*Primary Examiner* — Christina A Riddle
(74) *Attorney, Agent, or Firm* — WPAT LAW; Anthony King (57) ABSTRACT

An inspection apparatus includes: an inspection apparatus includes: a stage configured to receive a photomask; a radiation source configured to emit a first radiation beam for inspecting the photomask; and an aperture stop configured to receive a second radiation beam reflected from the photomask through an aperture of the aperture stop, wherein the aperture is tangent at a center of the aperture stop.

20 Claims, 7 Drawing Sheets

Related U.S. Application Data continuation of application No. 17/200,867, filed on Mar. 14, 2021, now Pat. No. 11,614,684.

(60) Provisional application No. 63/075,584, filed on Sep. 8, 2020.

(58) Field of Classification Search
CPC ............ G03F 7/70558; G03F 7/70591; G03F 7/70616–70683; G03F 7/70733; G03F 7/70741; G03F 7/7085; G03F 7/70858; G03F 7/70866; G03F 7/70908–70941; G03F 7/70975; G03F 7/70983; G03F 7/70991; G01N 21/956; G01N 21/95623
USPC .......... 355/30, 52–55, 67–77; 430/5, 22, 30; 356/237.1–237.6; 250/492.1, 492.2, 250/492.22, 492.23, 493.1, 503.1, 504 R, 250/505.1
See application file for complete search history.

(56) References Cited

U.S. PATENT DOCUMENTS

| | | | | |
|---|---|---|---|---|
| 2012/0086800 | A1* | 4/2012 | Vladimirsky | G06V 10/145 |
| | | | | 382/141 |
| 2017/0131528 | A1* | 5/2017 | Ruoff | G02B 17/0647 |
| 2017/0261654 | A1* | 9/2017 | Gilad | G02B 13/0055 |
| 2020/0225574 | A1* | 7/2020 | Kvamme | G03F 1/84 |

\* cited by examiner

PHOTOMASK INSPECTION METHOD AND APPARATUS THEREOF

PRIORITY CLAIM AND CROSS-REFERENCE

This application claims priority to U.S. Provisional Application No. 63/075,584 filed Sep. 8, 2020 and is a continuation of U.S. non-Provisional application Ser. No. 18/185,407 filed Mar. 17, 2023, which is a continuation of U.S. non-Provisional application Ser. No. 17/200,867 filed Mar. 14, 2021, now U.S. Pat. No. 11,614,684B2, the disclosures of which are hereby incorporated by reference in their entirety.

BACKGROUND

In advanced semiconductor technologies, the continuing reduction in device size and increasingly complex circuit arrangements have made the design and fabrication of integrated circuits (ICs) more challenging and costly. To pursue better device performance with smaller footprint and less power consumption, advanced lithography technologies, e.g., extreme ultraviolet (EUV) lithography, have been investigated as approaches to manufacturing semiconductor devices with a relatively small line width, e.g., 30 nm or less. EUV lithography employs a photomask to control the irradiation of a substrate under EUV radiation so as to form a pattern on the substrate.

While existing lithography techniques have improved, they still fail to meet requirements in many aspects. For example, there is a need to improve the quality of the photomask image in a photomask inspection operation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "photomask," "reticle" and "mask" used throughout the present disclosure refer to a device used in a lithography system, in which a patterned image according to a circuit pattern is formed on a substrate plate. The substrate plate may be transparent. The image of the circuit pattern on the photomask is transferred to a workpiece through a radiation source of the lithography system. Lithography radiation emitted from the radiation source is incident on the workpiece via the photomask in a transmissive or reflective manner.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

An extreme ultraviolet (EUV) photomask is typically a reflective mask that includes a circuit pattern formed thereon and is used to transfer the circuit pattern onto a workpiece, such as a wafer, through reflection of a patterned EUV radiation from a light-reflective layer of the EUV photomask during a lithography operation. The EUV photomask generally includes an anti-reflection coating (ARC) and a light-absorption layer (LAL) above the light-reflective layer, in which the ARC and the LAL are patterned to form the circuit pattern. The patterned EUV light is reflected from the light-reflective layer, through the patterned LAL and the ARC, and radiated onto the wafer.

After an EUV photomask is fabricated or when a fabricated EUV photomask has been operated for predetermined period, a routine photomask inspection is performed to ensure integrity and performance of the EUV photomask. If a defect or undesirable material is found in the EUV photomask, for example, if a phase defect is found in the light-reflective layer or a foreign particle is formed in the ARC or the LAL, a repairing operation is required to fix the defect. The inspection is generally performed by scanning the photomask to generate an image and examining whether any defect is found in the image. In advanced technology generations, the photomask defects have become smaller and more difficult to identify than those in previous technology generations. As a result, greater resolution of the inspection image is required to guarantee identification of all defects and provide a sufficient process window of a patterning operation.

The present disclosure provides a method of increasing quality and resolution of an inspection image of an EUV photomask. In the proposed scheme, an inspection apparatus is modified, in which an aperture for filtering inspection radiation beam is redesigned to have a greater diameter or width with a symmetrical shape to increase radiation intensity while reducing image distortion. In addition, tilt angle (referred to as a chief ray angle) of the incident radiation impinging onto the photomask is tuned according to the aperture, e.g., tuned to be greater than a tilt angle of a radiation beam used in a pattering operation, for improving light collection performance. Therefore, the proposed scheme generates an inspection image with greater intensity uniformity and reduced image distortion compared to images generated by existing inspection apparatuses. The effectiveness of defect detection is significantly enhanced accordingly.

Figure 1:
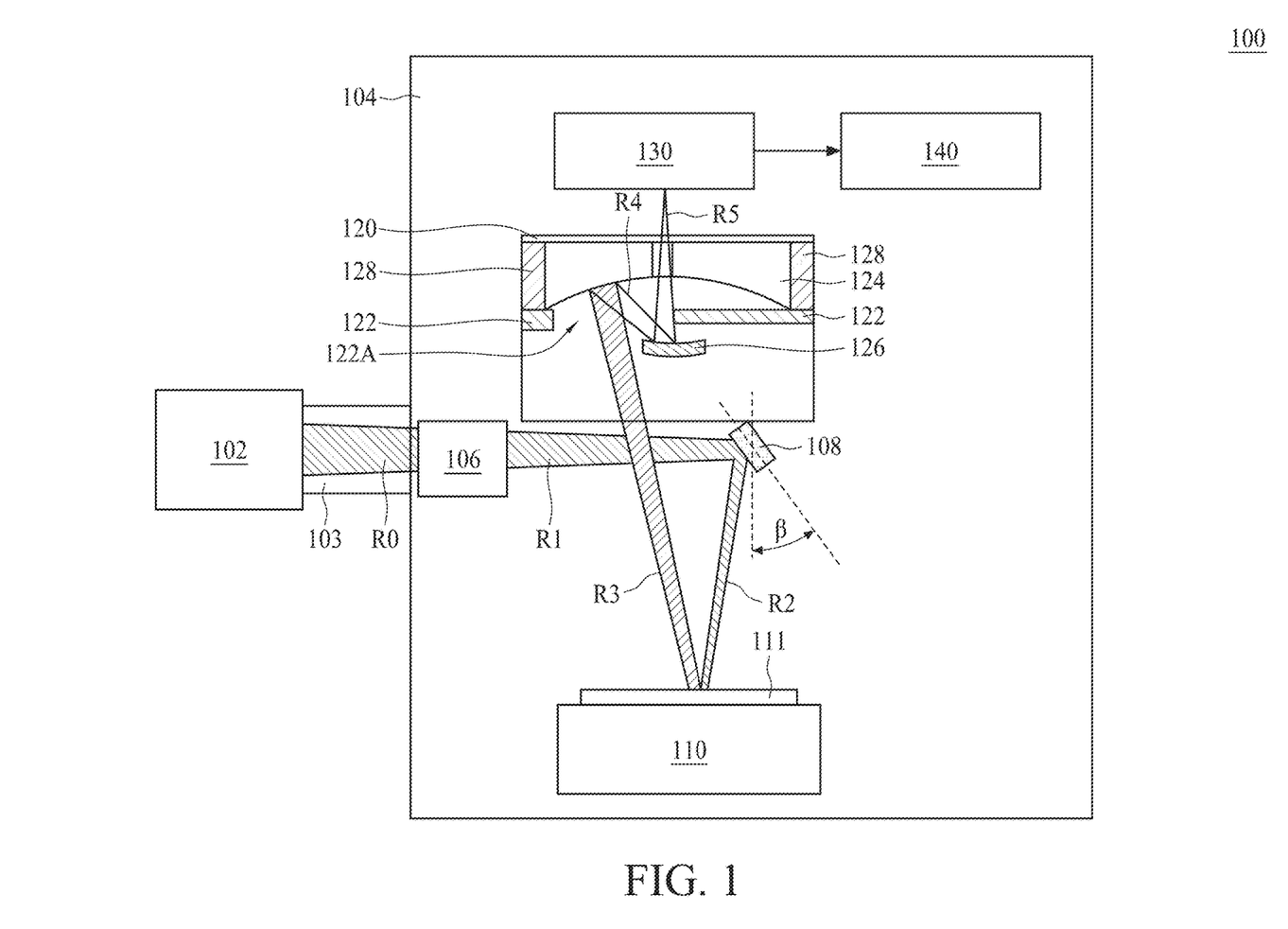
FIG. 1 is a schematic diagram of an inspection apparatus, in accordance with some embodiments of the present disclosure.

FIG. 1 is a schematic diagram of an inspection apparatus 100, in accordance with some embodiments of the present disclosure. In some embodiments, the inspection apparatus 100 is an EUV photomask inspection apparatus. In some embodiments, the inspection apparatus 100 is a reflection type inspection apparatus, a transmission type inspection apparatus, or a combination thereof. As shown in FIG. 1, the inspection apparatus 100 includes a radiation source 102 and a chamber 104. In some embodiments, the inspection apparatus 100 includes a channel 103 connecting the radiation source 102 and the chamber 104. In some embodiments, the radiation source 102 and the channel 103 are integrated into the chamber 104. In some embodiments, additional modules of the inspection apparatus 100, e.g., a power supply and a control device, may be present but are omitted from FIG. 1 for brevity.

The radiation source 102 is configured to generate a source radiation beam R0 and emit the source radiation beam R0 into the chamber 104 through the channel 103. In some embodiments, the source radiation beam R0 has a wavelength between about 1 nm and about 100 nm, such as about 13.5 nm. The source radiation beam R0 may be EUV light. In some other embodiments, the source radiation beam R0 has a wavelength of deep UV (DUV) or another suitable wavelength. In some embodiments, the radiation source 102 includes a plasma source, such as discharge-produced plasma (DPP) or laser-produced plasma (LPP). In some embodiments, the radiation source 102 also includes a collector, which may be used to collect light generated from the plasma source and to emit the source radiation beam R0 toward the chamber 104.

In some embodiments, the chamber 104 includes an illuminator (illumination system) 106, a mirror 108, a stage 110, a projection optics box (POB) 120, a detector 130, and a processor 140.

The illuminator 106 is configured to receive the source radiation beam R0 through the channel 103 to generate a radiation beam R1. In some embodiments, the illuminator 106 includes reflective optics, such as one or more mirrors, to direct light from the radiation source 102 onto the mirror 108 or the stage 110. In some examples, the illuminator 106 may include a zone plate, for example, to improve focus of the source radiation beam R0. In some embodiments, the illuminator 106 is configured to shape the source radiation beam R0 into, for example, a dipole shape, a quadrapole shape, an annular shape, a single beam shape, a multiple beam shape, and/or a combination thereof.

In some embodiments, the illuminator 106 includes, but is not limited to, an adjuster, an integrator and a condenser. In some embodiments, the illuminator 106 is configured to condition the source radiation beam R0 according to predetermined specifications, such as intensity distribution and uniformity of the radiation beam R1. In some embodiments, illuminator 106 adjusts the angular intensity distribution of the source radiation beam R0.

The radiation beam R1 is incident on the mirror 108, reflected by the mirror 108 and impinges onto the stage 110. The radiation beam impinging on the stage 110 is referred to as an illumination radiation beam R2. In some embodiments, the mirror 108 is formed of materials having an EUV reflectivity of greater than about 50%. In some embodiments, the mirror 108 has an EUV reflectivity of greater than 60% or greater than about 80%. The mirror 108 may include a multilayer structure. The mirror 108 may include pairs of light-reflective layers, wherein each pair is, e.g., formed of a molybdenum layer and a silicon layer. The number of alternating molybdenum layers and silicon layers (i.e., the number of molybdenum/silicon pairs) and the thicknesses of the molybdenum layers and the silicon layers are determined so as to facilitate constructive interference of individual reflected rays (referred to as Bragg reflection) to thereby increase the reflectivity of the mirror 108. The mirror 108 may be a planar mirror or an ellipsoidal mirror. In some embodiments, an incident (tilt) angle of the radiation beam R2 onto the photomask 111 is controlled by a tilt angle of the mirror 108.

In some embodiments, the chamber 104 includes one or more lenses or mirrors in the optical path between the radiation source 102 and the stage 110 to process or direct the radiation beam R0, R1 or R2. For example, an optical filter may be utilized to filter unwanted wavelengths of the source radiation beam R0. In some other examples, one or more ellipsoidal mirrors are provided in the chamber 104 to reflect and direct the source radiation beam R0 toward the mirror 108. The ellipsoidal mirror may include a multilayer structure made of molybdenum and silicon.

During an inspection operation, a workpiece, e.g., a photomask 111, is provided for inspection. In some embodiments, the stage 110 is used for supporting and holding the workpiece. The stage 110 may include one or more positioning devices, such as motors and roller guides, to provide accurate alignment and movement of the workpiece in various directions for achieving better performance in focusing, leveling, exposure or other movements.

In some embodiments, a pump unit (not separately shown) is configured to provide a substantially vacuum or high vacuum environment of the chamber 104 of the inspection apparatus 100. In some embodiments, the pump unit includes one or more pumps and filters.

The photomask 111 reflects the radiation beam R2 to form a reflected radiation beam R3. The radiation beam R3 is directed into the POB 120. During an inspection operation, the surface of the photomask 111 may be partitioned into a grid array and the radiation beam R2 is narrowed to illuminate each grid successively to complete the scan loop. When a phase defect or a surface foreign substance having a sufficient size exists in a grid where the radiation beam R2 is collected on the photomask 111, the radiation beam R3 will be scattered by the defect and the rays of the radiation beam R3 may go in different directions. The information of the defect is carried by the radiation beam R3 when the radiation beam R3 travels through the POB 120 and is detected by the detector 130.

In some embodiments, the POB 120 includes an aperture stop 122, a first reflective element 124, a second reflective element 126 and a holder 128. The aperture stop 122 is configured to filter the radiation beam R3 by blocking portions of the radiation beam R3. In some embodiments, the aperture stop 122 include an aperture 122A configured to allow desirable portions of the radiation beam R3 to pass through. In some embodiments, the holder 128 is an optical element holder used to hold and secure the first reflective element 124 and the aperture stop 122. The second reflective element 126 is arranged below the first reflective element 124 and may be hanged by one more support arms (not shown), in which the support arms are formed of rigid materials and extend from the aperture stop 122 or the holder 128 to the second reflective element 126.

Figure 3A:
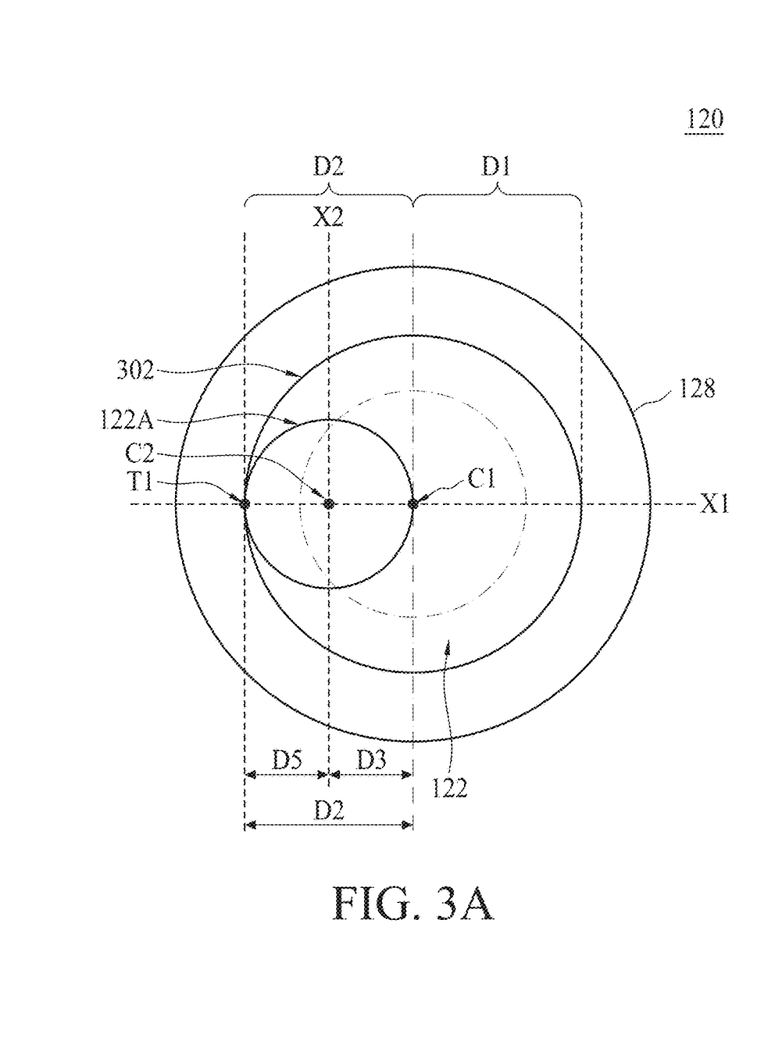
FIG. 3A is a schematic top view of a projection optics box, in accordance with some embodiments of the present disclosure.

In some embodiments, the holder 128 has a circular or ring shape from a top-view perspective, as illustrated in FIG. 3A. In some embodiments, the first reflective element 124 is laterally surrounded by the holder 128. In some embodiments, the aperture stop 122 is coupled to the holder 128 and integrated with the holder 128. In some embodiments, the aperture stop 122 is part of the holder 128, in which a first part of the holder 128 has a ring shape laterally surrounding the first reflective element 124 and a second part (corresponding to the aperture stop 122) of the holder 128 is coupled to the first part and has a circular shape defining an opening allowing the radiation beam R3 to pass through and reach the first reflective element 124. In some embodiments, the second part of the holder 128 is immediately between the first reflective element 124 and the second reflective element 126.

In some embodiments, the reflective elements 124 and 126 are configured to form a Schwarzschild illumination system. The first reflective element 124 may be configured as a condenser to reflect the radiation beam R3, in which a projected radiation beam R4 is collected by the second reflective element 126 to form a projected radiation beam R5, which travels through an opening of the reflective element 124 toward the detector 130. The Schwarzschild illumination system permits control of the collection angle of the radiation beam R5, which is intended to be received by the detector 130. In some embodiments, the reflective element 124 or 126 includes a planar mirror or an ellipsoidal mirror.

In some embodiments, the detector 130 is configured to generate an inspection image according to the received radiation beam R5. In some embodiments, the detector 130 is a photodetector, such as a solid state image sensor, e.g., a CCD or CMOS image sensor. The processor 140 may include a processing unit configured to generate the inspection image according to the electrical signals provided by the detector 130. In some embodiments, the processor 140 is configured to perform computations to identify whether a defect exists.

Figure 2:
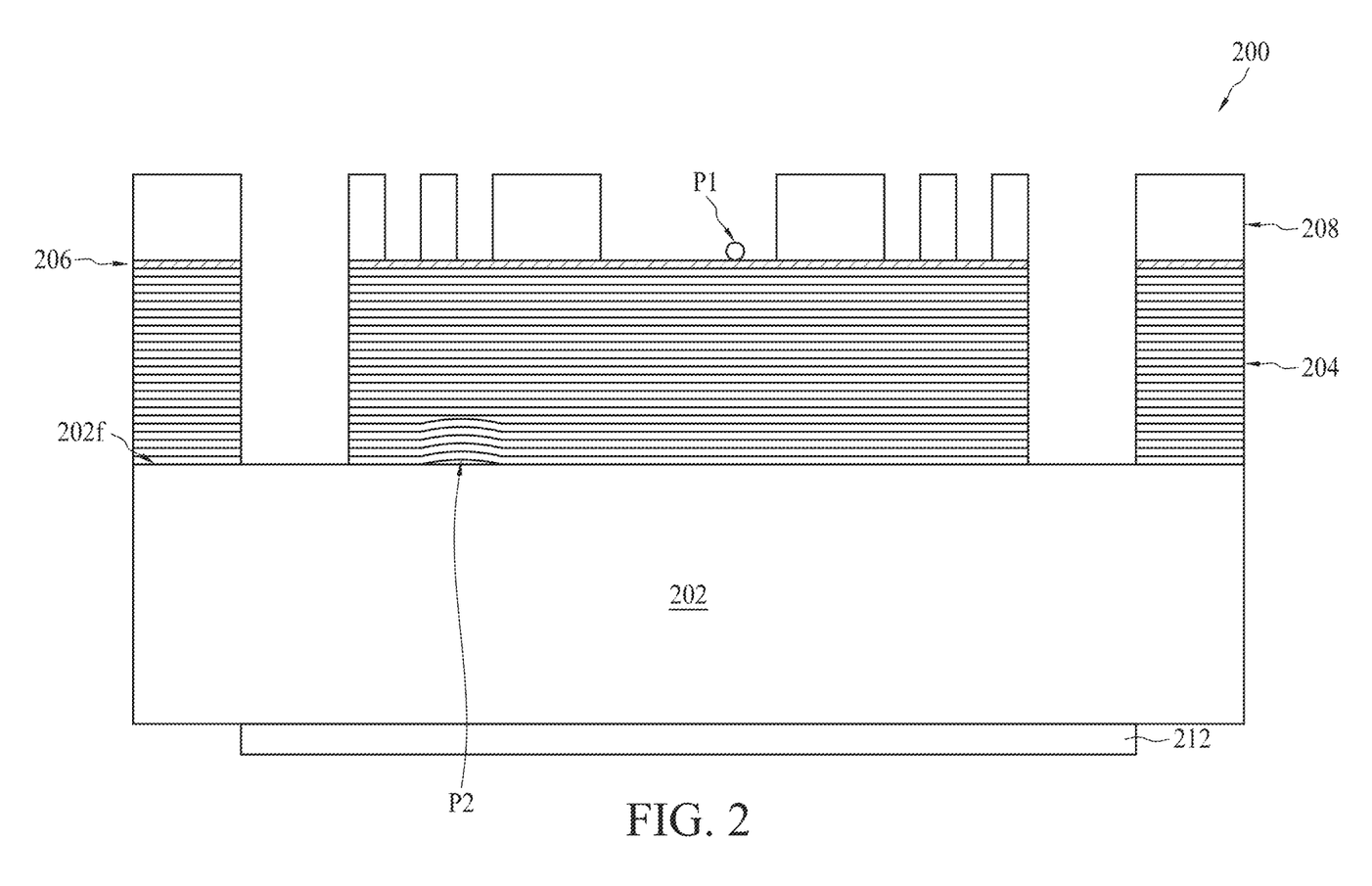
FIG. 2 is a schematic cross-sectional view of a photomask, in accordance with some embodiments of the present disclosure.

FIG. 2 is a schematic cross-sectional view of a photomask 200, in accordance with some embodiments of the present disclosure. The photomask 200 may be used as the photomask 111 as illustrated in FIG. 1. Referring to FIG. 2, the structure of the photomask 200 includes a substrate 202, a multilayer stack 204, a capping layer 206 and a light-absorption layer 208. Other configurations of the photomask 200, such as additional layers, may also be within the contemplated scope of the present disclosure.

The substrate 202 is formed of a low thermal expansion (LTE) material, such as fused silica, fused quartz, silicon, silicon carbide, black diamond and other low thermal expansion substances. In some embodiments, the substrate 202 serves to reduce image distortion resulting from mask heating. In the present embodiment, the substrate 202 includes material properties of a low defect level and a smooth surface. In some embodiments, the substrate 202 transmits light at a predetermined spectrum, such as visible wavelengths, infrared wavelengths near the visible spectrum (near-infrared), and ultraviolet wavelengths.

The multilayer stack 204 is formed over a front side 202f of the substrate 202. The multilayer stack 204 serves as a radiation-reflective layer of the photomask 200. The multilayer stack 204 may include pairs wherein each pair is formed of a molybdenum (Mo) layer and a silicon (Si) layer. The number of alternating Mo layers and Si layers (i.e., the number of Mo/Si pairs) and the thicknesses of the Mo layers and the Si layers are determined so as to facilitate constructive interference of individual reflected rays (i.e., Bragg reflection) and thus increase the reflectivity of the multilayer stack 204.

The capping layer 206 is disposed over the multilayer stack 204. In some embodiments, the capping layer 206 is used to prevent oxidation of the multilayer stack 204 during a mask patterning process. In some embodiments, the capping layer 206 is made of ruthenium (Ru) or ruthenium oxide ($RuO_2$). Other capping layer materials, such as silicon dioxide ($SiO_2$), amorphous carbon or other suitable compositions, can also be used in the capping layer 206.

The light-absorption layer 208 is disposed over the capping layer 206. In some embodiments, the light-absorption layer 208 is an anti-reflective layer that blocks or absorbs radiation in EUV wavelength ranges impinging onto the photomask 200. The light-absorption layer 208 may include chromium, chromium oxide, titanium nitride, tantalum nitride, tantalum oxide, tantalum boron nitride, tantalum, titanium, aluminum-copper, combinations thereof, or the like. The light-absorption layer 208 may be formed of a single layer or of multiple layers. For example, the light-absorption layer 208 includes a chromium layer and a tantalum nitride layer.

In some embodiments, an antireflective layer (not shown) is disposed over the light-absorption layer 208. The antireflective layer may reduce reflection of the impinging radiation having a wavelength shorter than those of the DUV range from the light-absorption layer 208, and may include a same pattern as that of the underlying light-absorption layer 208. Other materials, such as $Cr_2O_3$, ITO, SiN and $TaO_5$, may also be used. In other embodiments, a silicon oxide film is adopted as the antireflective layer.

In some embodiments, the photomask 200 further includes a conductive layer 212 on a backside of the substrate 202. The conductive layer 212 may aid in engaging the photomask 200 with an electric chucking mechanism (not separately shown) in a lithography system. In some embodiments, the conductive layer 212 includes chromium nitride (CrN), chromium oxynitride (CrON), or another suitable conductive material.

Referring to FIGS. 1 and 2, a first type defect of the photomask 200 may be present in a form of a contamination particle P1 residing on the surface of the photomask 200, e.g., the capping layer 206 or the absorption layer 208. In some embodiments, the contamination particle P1 may obscure the illumination and reflection of the radiation beam of the multilayer stack 204. In an example, a phase-defected portion P2 of the multilayer stack 204 is present as a second type defect, which would cause phase errors in the reflected radiation beam. In a photomask inspection operation, the inspection apparatus 100 is operated to determine whether any defects exist by identifying the defect P1 or P2 in the inspection image. The defected areas of the inspection image corresponding to the defects P1 and P2 of the photomask 200 may be shown with different grayscales as compared to their neighboring features due to scattered radiation beam R3 around the defect P1 or P2. Therefore, defect detection effectiveness is determined by the characteristics of the reflected radiation beam R3, e.g., the illumination intensity, the intensity variation and illumination symmetry in different axes.

FIG. 3A is a schematic top view of the POB 120, in accordance with some embodiments of the present disclosure. Some features of the POB 120, such as the reflective elements 124 and 126, are omitted from FIG. 3A for clarity. As discussed above, the aperture stop 122 is configured to filter undesired portions of the radiation beam R3 through the aperture 122A for obtaining a better-quality inspection image. In some embodiments, the aperture 122A is designed to increase the illuminous flux entering the POB 120 so as to enhance ability to detect defects. In addition, the geometry of the aperture 122A, such as its location and shape, is related to the chief ray of the radiation beam R3 as shown in FIG. 1 to capture a maximal amount of the radiation beam R3 with a symmetrical optical distribution. In some embodiments, the performance of the aperture stop 122 is compromised by various structural limitations of the POB 120, and thus the existing aperture cannot achieve a theoretically optimal design to allow for a maximal amount of light to pass through. The structure limitations of the POB 120 include, but are not limited to, the arrangement of the holder 128 and the second reflective element 126.

In some embodiments, the aperture stop 122 is defined by a periphery or circumference 302. In other words, periphery 302 is shared by the aperture stop 122 and the ring of the holder 128. In some embodiments, the aperture 122A is arranged within the area defined by the periphery 302 or the holder 128. In the aperture stop 122, the aperture 122A is arranged on one side of the aperture stop 122. In some embodiments, the aperture 122A contacts the ring of the holder 128. In some embodiments, the aperture stop 122 has a circular shape with a center C1, and the aperture 122A has a circular shape with a center C2, wherein the center C2 does not coincide with the center C1 of the aperture stop 122. In some embodiments, the aperture 122A and the aperture stop 122 are not concentric.

In some embodiments, the aperture stop 122 has a half-width D1 measured between the center C1 and the periphery 302 of the holder 128. In cases where the aperture stop 122 has a circular shape, the half-width D1 is a radius of the aperture stop 122. In embodiments where the aperture 122A has a circular shape, the aperture 122A has a diameter D2 substantially equal to the radius D1. In some embodiments, the aperture 122A contacts or is tangent to the holder 128 at a point T1. In some embodiments, the aperture 122A contacts or is tangent to the periphery of the aperture stop 122 at a point T1. The aperture 122A may also contact or be tangent to the center C1. In the present embodiment, a distance D5 between the center C2 and the point T1 is equal to the distance D3.

In the proposed photomask inspection scheme, the aperture 122A is arranged to have a symmetric shape. As discussed above, when the aperture 122A has a circular shape, the aperture 122A is symmetrical with respect to any axis that extends through the center C2 of the aperture 122A. In some embodiments, the aperture 122A is arranged to be symmetrical with respect to at least two axes X1 and X2, wherein the axes X1 and X2 are perpendicular to each other.

Through the proposed aperture 122A, higher order diffraction of the radiation beam R3 is blocked by the aperture stop 122, and the illuminous flux of the radiation beam R3 can achieve a maximal value under the constraint of the holder 128 while the optical distribution of the radiation beam R3 is made to be as uniform as possible due to the symmetry of the aperture 122A.

Figure 3B:
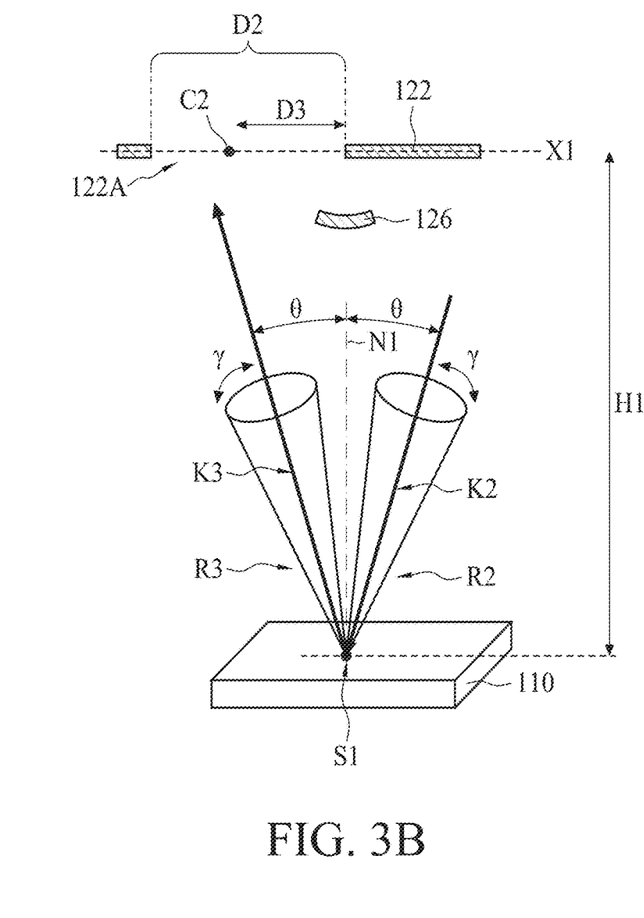
FIG. 3B is a schematic view of an incident radiation beam and a reflection radiation beam in an inspection operation, in accordance with some embodiments of the present disclosure.

FIG. 3B is a schematic view of the illumination radiation beam R2 and the reflected radiation beam R3, in accordance with some embodiments of the present disclosure. Referring to FIGS. 3A and 3B, the radiation beam R2 is incident on the photomask 111 at a tilt angle θ, wherein the tilt angle θ is measured between a chief ray K2 of the radiation beam R2 and an axis N1, which is a normal line perpendicular to the surface of the photomask 111. The radiation beam R3 also has a tilt angle θ measured between the chief ray K3 of the radiation beam R3 and the axis N1 due to the principle of reflection. Referring to FIG. 1 and FIG. 3B, the radiation beam R2 with the tilt angle θ may be obtained by controlling the mirror 108, e.g., by adjusting a tilt angle β of the mirror 108 and/or shifting the location of the mirror 108 according to the tilt angle θ.

In some embodiments, the radiation beam R2 has a marginal ray to define the range of a beam cone, in which a half-angle γ of the beam cone represents a convergence or divergence of the radiation beam R2. In some embodiments, the light within the beam cone of radiation beam R2 includes an intensity level of about 1/e² (i.e., about 13.5%) of the total intensity of the radiation beam R2. In some embodiments, the angle γ is set at about six degrees. In some other embodiments, other values of the angle γ greater than or less than six degrees, e.g., five degrees, are also possible. In some embodiments, the angle γ is determined according to an existing tilt angle α used in a lithography operation. In some embodiments, the existing tilt angle α is different from the proposed tilt angle θ.

In some embodiments, the tilt angle θ is determined according to the configurations of the aperture 122A and the aperture stop 122 for aligning the chief ray K3 of the radiation beam R3 with the center C2 of the aperture 122A. In some embodiments, the tilt angle θ is determined based on the location of the center C2 of the aperture 122A. In some embodiments, the tilt angle θ is calculated by the following formula:

$$\theta = \tan^{-1}(D3/H1),$$

wherein the width D3 denotes a horizontal distance between the center C2 of the aperture 122A and the center of an illumination spot S1 of the photomask 111 at which the radiation beam R2 impinges onto the photomask. The height H1 represents the vertical distance between the surface of the photomask 111 (or the stage 110) and the aperture stop 122. In some embodiments, the center C1 of the aperture stop 122 vertically coincides with the illumination spot S1 of the photomask 111, and thus the width D3 is equal to the radius D3 of the aperture 122A shown in FIG. 3A given that the aperture 122A has a circular shape.

In some embodiments, the tilt angle θ is set at greater than the angle γ. In some embodiments, the tilt angle θ is set at greater than the angle γ by about three degrees. In some embodiments, the tilt angle θ is in a range between about 8.5 degrees and about 9.5 degrees, or between about 8.8 degrees and about 9.2 degrees. In some embodiments, the tilt angle θ is set at about nine degrees.

In some embodiments, a numerical aperture (NA) associated with the radiation beam R2 is defined by the following equation, $$NA = \sin^{-1}(\pi/180 * \theta).$$

Through the proposed design of the aperture 122A combined with the operation of the radiation beam R2 having the incident tilt angle θ, the amount of light entering the detector 130 can be increased while the spatial distribution of the radiation beam R2 is made more uniform, thereby mitigating or eliminating feature distortion in the inspection image.

In some embodiments, the size or width of the aperture 122A is determined according to the location of the second reflective element 126 of the POB 120. In some embodiments, referring to FIG. 1 and FIG. 3B, the radiation beam R3 is designed to travel from the photomask 111 to the first reflective element 124. Therefore, the radiation beam R3 should be prevented from hitting the second reflective element 126 before reaching the first reflective element 124. In some embodiments, the aperture 122A is laterally spaced apart from the second reflective element 126 in order to ensure that the radiation beam R3 is not blocked by the second reflective element 126. In some embodiments, the (right) side of the aperture 122A is defined by the (left) side of the second reflective element 126 such that the aperture 122A does not overlap the second reflective element 126 from a top-view perspective. In some embodiments, since the second reflective element 126 is arranged at the center C2 and coincides with the center C1 of the aperture stop 122 from a top-view perspective, the maximal value of the diameter D2 of the aperture 122A is limited by the center C1.

In some embodiments, as illustrated in FIG. 1 and FIG. 3B, the aperture 122A is designed to allow the received radiation beam R5 to pass through the POB 120 and reach the detector 130. Therefore, the aperture 122A has at least a portion overlapping the second reflective element 126 when viewed from above such that the received radiation beam R5 can propagate through the POB 120 without being blocked.

Figure 4A:
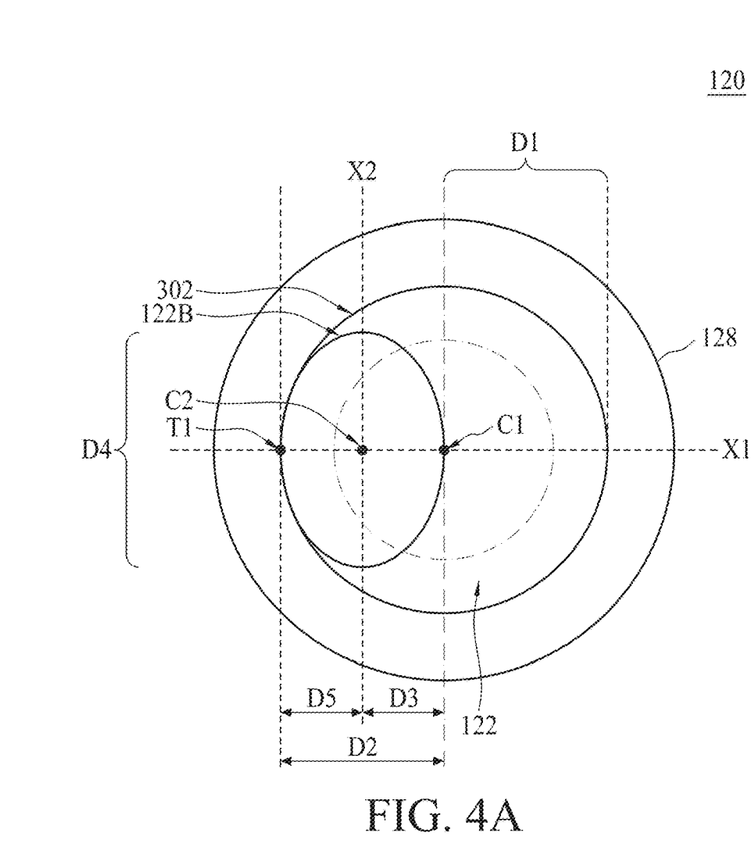
FIG. 4A is a schematic top view of a projection optics box, in accordance with some embodiments of the present disclosure.

FIG. 4A is a schematic top view of the POB 120, in accordance with another embodiment of the present disclosure. The POB 120 shown in FIG. 4A is similar to the POB 120 shown in FIG. 3A, except that the aperture stop 122 shown in FIG. 4A includes an aperture 122B with a shape different from that of the aperture 122A. In some embodiments, the aperture 122B has an elliptical shape, wherein the ellipse has a major axis that extends in the direction of the axis X2 and a minor axis that extends in the direction of the axis X1. Although the aperture 122B has a shape different from that of the aperture 122A, the aperture 122B is still within the scope of the aperture stop 122 as defined by the holder 128 or the periphery 302.

The ellipse of the aperture 122B has a width D2, i.e., a dimension of the minor axis measured from a point T1 that contacts the holder 128 to the center C1 of the aperture stop 122. A center C2 of the aperture 122B is located at the intersection of the major and minor axes of the aperture 122B. The width D3 of the semi-minor axis of the aperture 122B is equal to the radius D3 of the aperture 122A. In the present embodiment, the distance D5 of the aperture 122B between the center C2 and the point T1 is equal to the distance D3 of the aperture 122B.

The aperture 122B is symmetrical with respect to the axes X1 and X2. As such, the aperture 122B is configured to seek a balance between maximizing its area and maintaining symmetry of its shape. According to the arrangement of the aperture 122B, the area of the aperture 122B is greater than the area of the aperture 122A, and thus the total amount of light passing through the aperture 122B is greater than that passing through the aperture 122A while still maintaining the advantage of symmetry with respect to the axes of the major and minor axes.

Figure 4B:
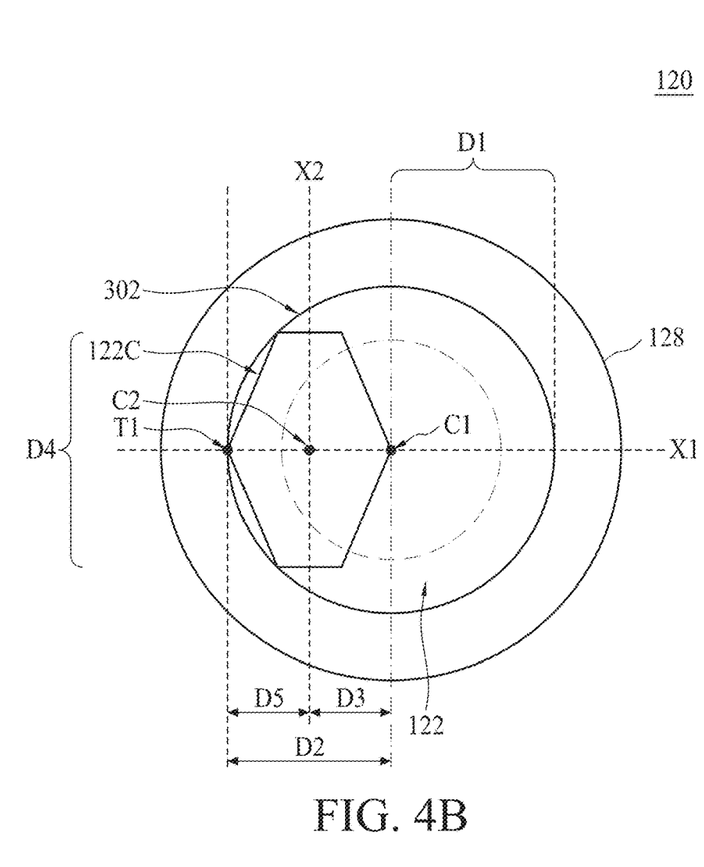
FIG. 4B is a schematic top view of a projection optics box, in accordance with some embodiments of the present disclosure.

FIG. 4B is a schematic top view of the POB 120, in accordance with yet another embodiment of the present disclosure. The POB 120 shown in FIG. 4B is similar to the POB 120 shown in FIG. 3A, except that the aperture stop 122 shown in FIG. 4B includes an aperture 122C with a polygonal shape, such as a rectangle, a hexagon, an octagon, or the like. In some embodiments, the aperture 122C has a hexagonal shape with three vertices coinciding with the holder 128 or the periphery 302 of the aperture stop 122. Although the aperture 122C has a shape different from that of the aperture 122A or 122B, the aperture 122C is still within the scope of the aperture stop 122 as defined by the holder 128.

The polygon of the aperture 122C is symmetrical with respect to the axes X1 and X2. The symmetry of the aperture 122C with respect to at least two axes provides reduced image distortion while allowing a sufficient amount of light to pass through.

Figure 4C:
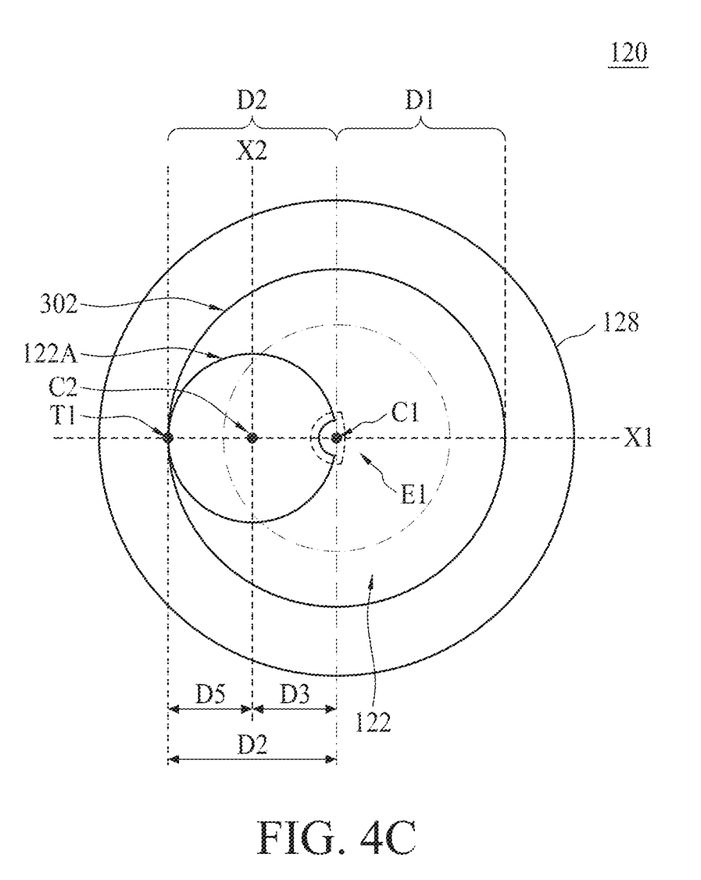
FIG. 4C is a schematic top view of a projection optics box, in accordance with some embodiments of the present disclosure.

FIG. 4C is a schematic top view of the POB 120, in accordance with yet another embodiment of the present disclosure. The POB 120 shown in FIG. 4C is similar to the POB 120 shown in FIG. 3A, except that the aperture stop 122 shown in FIG. 4B includes an aperture 122D, in which a portion E1, which overlaps the center C1, is cut off from the circular shape of the aperture 122A in FIG. 3A to facilitate imaging performance of the inspection apparatus 100. In other words, the aperture stop 122, including the cut-off portion E1, defines the shape of the aperture 122D. In some embodiments, the diameter of the aperture 122D is greater than the diameter D2 of the aperture 122A, and the cut-off portion E1 is shifted to the right side of the center C1 and offset from the center C1. In such circumstance, the aperture 122D overlaps the center C1 from a top-view perspective. In some embodiments, the aperture 122D overlaps the second reflective element 126 from a top-view perspective.

Figure 5:
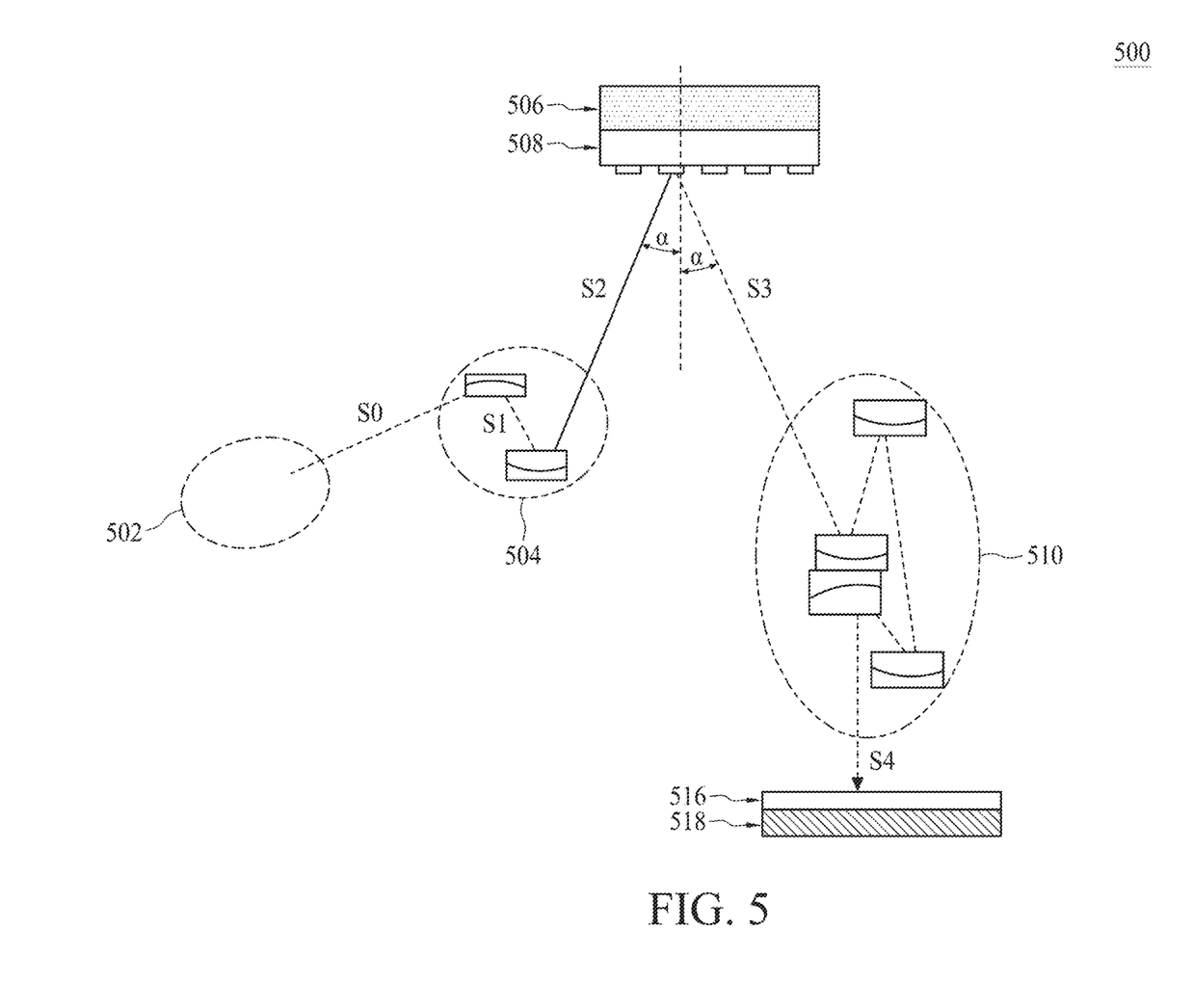
FIG. 5 is a schematic diagram of a lithography apparatus, in accordance with some embodiments of the present disclosure.

FIG. 5 is a schematic diagram of a lithography apparatus 500, in accordance with some embodiments of the present disclosure. The lithography apparatus 500 may be configured to perform reflective type lithography, such as extreme ultraviolet (EUV) lithography, or transmission type lithography. In some embodiments, the lithography apparatus 500 is configured to perform lithography operation using a reflective type photomask. The lithography apparatus 500 of FIG. 1 includes a radiation source 502, an illuminator 504, a mask stage 506, a projection optics box (POB) 510, and a substrate stage 518.

The radiation source 502 is configured to generate a source radiation beam S0, e.g., an EUV light having a wavelength between about 1 nm and about 100 nm, such as 13.5 nm. In some embodiments, the radiation source 502 is similar to the radiation source 102 of the inspection apparatus 100.

In some embodiments, the illuminator 504 includes reflective optics, such as one or more mirrors, to direct light from the radiation source 502 through one or more reflections to form illumination radiation beams S1 and S2, in which the illumination radiation beam S2 impinges onto the mask stage 506. In some examples, the illuminator 504 includes a zone plate to improve focus of the source radiation beam S0. In some embodiments, the illuminator 504 is configured to shape the source radiation beam S0. In some embodiments, the illuminator 504 is configured to provide an on-axis illumination (ONI) to the photomask 508. In some embodiments, the illuminator 504 is configured to provide an off-axis illumination (OAI) to the photomask 508. In some embodiments, the illuminator 504 has a configuration similar to that of the illuminator 106 of the inspection apparatus 100.

The mask stage 506 is configured to secure a photomask 508, wherein the photomask 508 is similar to the photomask 111 or 200 as discussed above. In some embodiments, the mask stage 506 includes an electrostatic chuck (e-chuck) to secure the photomask 508.

The wafer stage 518 is used for supporting and holding a workpiece 516. The wafer stage 518 may include one or more positioning devices, such as motors and roller guides, to provide accurate alignment and movement of the workpiece in various directions for achieving better performance in focusing, leveling, exposure or other movements.

The workpiece 516 is provided with a substrate having a material layer formed thereon. The substrate may be a wafer substrate. In various embodiments, the wafer substrate includes a semiconductor wafer, such as a silicon wafer, germanium wafer, silicon-germanium wafer, III-V semiconductor wafer, or other type of wafer as known in the art. The material layer may be a photosensitive material, e.g., a photoresist sensitive to EUV radiation.

A reflected radiation beam S3 is reflected from the photomask 508 and directed toward the POB 510. The POB 510 serves the functions of transferring the image of the circuit pattern on the photomask 508 to the workpiece 516. The POB 510 may be configured to focus the illumination radiation beam S3 and projects a projection radiation beam S4 onto the workpiece 516. The projection radiation beam S4 is used for patterning the workpiece 516 by transferring the circuit pattern of the photomask 508 onto the workpiece 516 through the POB 510. The POB 510 may include one or more reflective optics for forming the projection radiation beam S4. In some embodiments, the configurations of the POB 510 of the lithography apparatus 500 and the POB 120 of the inspection apparatus 100 may be similar or different.

In some embodiments, the optical components of the illuminator 504 are configured to provide an illumination to the photomask 508 at predetermined locations. The optical components of the illuminator 504 are configurable to reflect the illumination radiation beam S2 to impinge on the photomask 508 at a predetermined tilt angle $\alpha$. The tilt angle $\alpha$ is determined to increase reflectivity of the photomask 508 while reducing a shadow effect. In some embodiments, the tilt angle $\alpha$ is determined according to the optical configurations of the illuminator 504 and/or the POB 510 to achieve desirable lithography performance of the workpiece 516. In some embodiments, the tilt angle $\alpha$ is in a range between about 5.0 degrees and about 7.0 degrees, such as 6.0 degrees.

In some embodiments, the tilt angle $\theta$ is set at greater than the tilt angle $\alpha$. In some embodiments, the tilt angle $\theta$ is set at greater than the tilt angle $\alpha$ by about three degrees.

Since the configurations of the illuminator 504 and the POB 510 may not be similar to the configurations of the illuminator 106 and the POB 120, operating the inspection apparatus 100 by setting the tilt angle $\theta$ to be identical to the tilt angle $\alpha$ of the lithography apparatus 500 may not provide the optimal imaging performance. Further, the existing aperture shape on the aperture stop 122 shown in FIG. 1 may not be symmetrical due to the constraint of the tilt angle $\alpha$. In contrast, the proposed aperture design is not limited by the constraint of the tilt angle $\alpha$ determined for the lithography apparatus 500 for pursuing the maximal light along with a symmetrical aperture shape. The tilt angle of the radiation beam for illuminating the photomask is also determined according to the new design of the symmetrical aperture. As a result, the inspection image generated by the proposed scheme can provide better intensity performance and reduced edge distortion, e.g., improving the blurred edges of features or scale asymmetry between the features in the X-axis and Y-axis.

Figure 6:
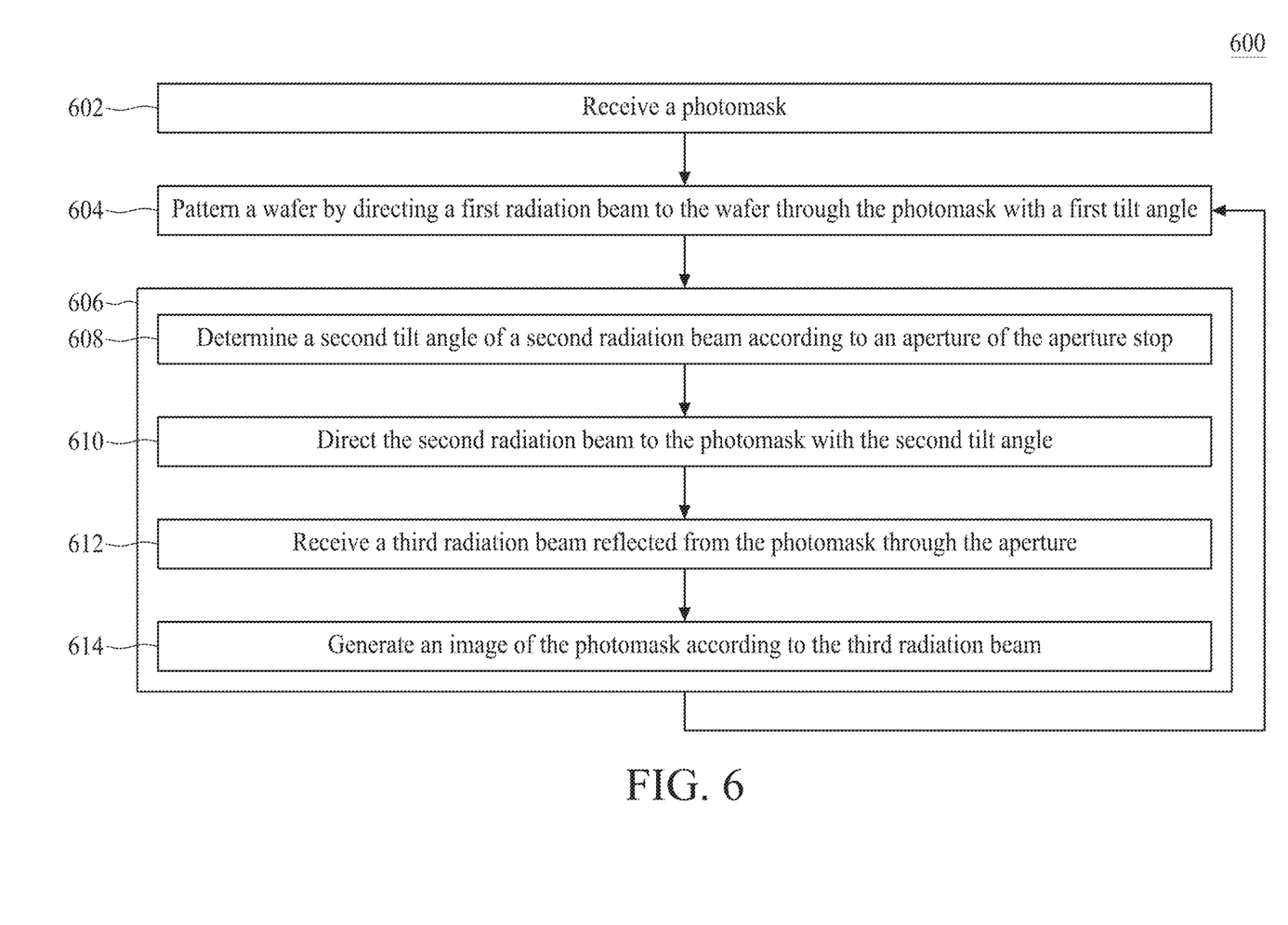
FIG. 6 is a flowchart of a method of inspecting a photomask, in accordance with some embodiments of the present disclosure.

FIG. 6 is a flowchart of a method 600 of inspecting a photomask, in accordance with some embodiments of the present disclosure. It should be understood that additional steps can be provided before, during, and after the steps shown in FIG. 6, and some of the steps described below can be replaced or eliminated, for additional embodiments of the method. The order of the steps may be changed. Materials, configurations, dimensions, processes and/or operations the same as or similar to those described with respect to the foregoing embodiments may be employed in the following embodiments, and the detailed explanation thereof may be omitted.

At step 602, a photomask is received. The photomask may be the photomask 111, 200 or 508 discussed above. At step 604, a wafer is patterned by directing a first radiation beam to the wafer through the photomask at a first tilt angle α. The wafer is patterned by a lithography operation performed by a lithography apparatus, such as the lithography apparatus 500. The wafer may be similar to the workpiece 516 shown in FIG. 5. In some embodiments, the first tilt angle α is set at six degrees.

At step 606, an inspection apparatus, e.g., the inspection apparatus 100 shown in FIG. 1, is operated to inspect the photomask. The inspection apparatus has a POB including an aperture stop. The aperture stop may include an aperture with a symmetrical shape, as discussed with reference to FIGS. 3A, 3B, 4A and 4B. The operation of the inspection apparatus may include steps 608, 610, 612 and 614, as described below.

At step 608, a second tilt angle θ of a second radiation beam is determined according to an aperture of the aperture stop. In some embodiments, the second tilt angle θ is greater than the first tilt angle α.

At step 610, the second radiation beam is directed to the photomask at the second tilt angle θ. In some embodiments, the operation of the inspection apparatus includes rotating or shifting a mirror of the inspection apparatus to cause the second radiation beam to be directed to the photomask at the second tilt angle θ.

At step 612, a third radiation beam reflected from the photomask is received through the aperture. At step 614, an image of the photomask is generated according to the third radiation beam.

In some embodiments of the present disclosure, after the inspection of the photomask, the method 600 returns to step 604 to perform the lithography operation of the wafer or another wafer if no defects are found. In some other embodiments, a repairing operation is performed to fix the defect of the photomask before the photomask is sent for another lithography operation. The order of steps 604 and 606 may be interchanged.

According to an embodiment of the present disclosure, an inspection apparatus includes: a stage configured to receive a photomask; a radiation source configured to emit a first radiation beam for inspecting the photomask; and an aperture stop configured to receive a second radiation beam reflected from the photomask through an aperture of the aperture stop, wherein the aperture is tangent at a center of the aperture stop.

According to an embodiment of the present disclosure, an inspection apparatus includes: a radiation source configured to emit a first radiation beam for inspecting a photomask, wherein a tilt angle of the first radiation beam is measured between a chief ray of the first radiation beam and a first axis perpendicular to a surface of the photomask; and an aperture stop configured to receive a second radiation beam reflected from the photomask through an aperture of the aperture stop, the aperture tangent at a center of the aperture stop.

According to an embodiment of the present disclosure, an inspection apparatus includes: a radiation source configured to emit a first radiation beam for inspecting a photomask; and a projection optics box comprising an aperture stop, wherein the aperture stop defines an aperture, wherein the aperture is tangent at a center of the aperture stop, wherein a first tilt angle at which a second radiation beam is incident on the photomask is determined according to the aperture. The projection optics box is further configured to receive a third radiation beam reflected directly from the photomask through the aperture.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An inspection apparatus, comprising:
   a stage configured to receive a photomask;
   a radiation source configured to emit a first radiation beam for inspecting the photomask; and
   an aperture stop configured to receive a second radiation beam reflected from the photomask through an aperture of the aperture stop, wherein the aperture is tangent at a center of the aperture stop.

2. The inspection apparatus according to claim 1, further comprising a mirror configured to direct a third radiation beam to the photomask at a first tilt angle.

3. The inspection apparatus according to claim 2, wherein a wafer is configured to be patterned by transmitting a fourth radiation beam to the photomask at a second tilt angle in a lithography apparatus different from the inspection apparatus, wherein the first tilt angle is greater than the second tilt angle by about three degrees.

4. The inspection apparatus according to claim 2, wherein the first tilt angle is about nine degrees.

5. The inspection apparatus according to claim 2, wherein the mirror is configured at a third tilt angle such that the first radiation beam is configured to be reflected by the mirror and thereby the third radiation beam impinges on the photomask at the first tilt angle.

6. The inspection apparatus according to claim 1, further comprising a projection optics box including the aperture stop, wherein a chief ray of the second radiation beam coincides with a center of the aperture.

7. The inspection apparatus according to claim 6, wherein the projection optics box further comprises a holder configured to hold the aperture stop, wherein the aperture is tangent to the holder.

8. The inspection apparatus according to claim 1, wherein the aperture is symmetrical with respect to at least a first axis and a second axis different from the first axis.

9. The inspection apparatus according to claim 1, wherein the aperture has a diameter substantially equal to a radius of the aperture stop.

10. The inspection apparatus according to claim 1, wherein the aperture has a polygonal shape.

11. An inspection apparatus, comprising:
    a radiation source configured to emit a first radiation beam for inspecting a photomask, wherein a tilt angle of the first radiation beam is measured between a chief ray of the first radiation beam and a first axis perpendicular to a surface of the photomask; and
    an aperture stop configured to receive a second radiation beam reflected from the photomask through an aperture of the aperture stop, the aperture tangent at a center of the aperture stop.

12. The inspection apparatus according to claim 11, wherein the first radiation beam is formed as a beam cone having an angle less than the tilt angle.

13. The inspection apparatus according to claim 11, wherein the aperture stop has a first width measured from a periphery of the aperture stop to the center of the aperture stop, and the aperture has a second width equal to the first width.

14. The inspection apparatus according to claim 13, wherein the aperture is symmetrical with respect to a second axis perpendicular to a third axis along which the first width is measured.

15. The inspection apparatus according to claim 13, wherein the inspection apparatus further includes a reflective element configured to receive the second radiation beam, wherein the second width of the aperture is further determined according to a location of the reflective element.

16. The inspection apparatus according to claim 11, wherein the aperture has a circular or elliptical shape.

17. An inspection apparatus, comprising:
 a radiation source configured to emit a first radiation beam for inspecting a photomask; and
 a projection optics box comprising an aperture stop, wherein the aperture stop defines an aperture, wherein the aperture is tangent at a center of the aperture stop, wherein a first tilt angle at which a second radiation beam is incident on the photomask is determined according to the aperture,
 wherein the projection optics box is further configured to receive a third radiation beam reflected directly from the photomask through the aperture.

18. The inspection apparatus according to claim 17, further comprising a mirror configured at a second tilt angle for reflecting the first radiation beam to form the second radiation beam.

19. The inspection apparatus according to claim 17, wherein a first distance from a periphery of the aperture to the center of the aperture stop is equal to a second distance from the center of the aperture stop and a periphery of the aperture stop.

20. The inspection apparatus according to claim 17, wherein the aperture contacts a periphery of the aperture stop.

\* \* \* \* \*